May 7, 1968 C. R. HURTIG 3,382,463

VARIABLE FREQUENCY VOLTAGE CONTROLLED CRYSTAL OSCILLATOR

Filed Feb. 20, 1967 5 Sheets-Sheet 1

INVENTOR.
CARL R. HURTIG
BY
Kenway, Jenney & Hildreth
ATTORNEYS

INVENTOR.
CARL R. HURTIG

BY

Kenway, Jenney & Hildreth
ATTORNEYS

INVENTOR.
CARL R. HURTIG
BY
Kenway, Jenney & Hildreth
ATTORNEYS

VARIABLE FREQUENCY VOLTAGE CONTROLLED CRYSTAL OSCILLATOR

Filed Feb. 20, 1967 5 Sheets-Sheet 4

INVENTOR.
CARL R. HURTIG
BY
Kenway, Jenney & Hildreth
ATTORNEYS

VARIABLE FREQUENCY VOLTAGE CONTROLLED CRYSTAL OSCILLATOR

Filed Feb. 20, 1967 5 Sheets-Sheet 5

INVENTOR.
CARL R. HURTIG
BY
Kenway, Jenney & Hildreth
ATTORNEYS

United States Patent Office 3,382,463
Patented May 7, 1968

3,382,463

VARIABLE FREQUENCY VOLTAGE CONTROLLED CRYSTAL OSCILLATOR

Carl R. Hurtig, Greenbush, Mass., assignor to Damon Engineering, Inc., Needham Heights, Mass., a corporation of Massachusetts Filed Feb. 20, 1967, Ser. No. 617,152
7 Claims. (Cl. 332—26)

ABSTRACT OF THE DISCLOSURE

This invention relates to linear crystal controlled oscillator circuits. The oscillator includes a frequency determining portion which is composed of two networks. The first network includes the frequency controlling crystal, whose admittance is highly dependent upon frequency. The second network, whose admittance is a linear function of frequency and a non-linear function of modulating voltage, includes a voltage controlled capacitance, to which the modulating voltage is applied. Parameters of the two networks are selected to make the frequency response of the oscillator linearly dependent on modulating voltage. The full specification should be consulted for a complete understanding of the invention.

*Disclosure*

My invention relates to electronic oscillators, and particularly to novel variable frequency, voltage controlled crystal oscillators.

Crystal oscillators are commonly employed where high frequency stability is desired. To obtain the advantages of crystal control without being restricted by the precise resonant frequency of particular crystals, various means have been devised for adjusting or modulating the frequency of such crystal oscillators. A common expedient is to use a semi-conductor, having a capacitance controlled by an applied voltage, connected in a frequency determining network with the crystal to form an oscillator control network. Such a network can be precisely tuned over a range of frequencies to a frequency dependent on the modulation voltage applied to the variable capacitance semi-conductor for use as a source of frequency modulated signals.

For that use, it is highly desirable that the frequency of the oscillator be linearly dependent on the applied modulating voltage. However, the semi-conductor devices which are voltage-variable capacitors, are highly non-linear in their response to applied voltage. While it is possible to construct a device exhibiting a linear relationship between applied voltage and capacitance, such devices are inherently quite expensive. Further, such devices are generally of low Q, high temperature sensitivity, and relatively large physical size.

In order to avoid this expense while obtaining a net linear relationship, it has been proposed to supply a non-linear voltage-variable capacitance device wtih a non-linear modulating voltage, thereby compensating for the non-linearity of the variable capacitance. Such a non-linear modulating voltage may be obtained with a series of properly interconnected diodes. However, such an arrangement is inherently expensive and is sensitive to changes in bias voltages A further disadvantage of a device making use of a number of diodes is that the contact voltages of the individual diodes are sufficiently unpredictable that each network must be made up of carefully selected components.

It is, therefore, a primary object of my invention to provide a crystal oscillator, whose frequency, at least over a range of interest, is linearly dependent on an applied modulating voltage.

It is possible to tune crystal oscillators in the vicinity of the parallel resonance frequency of the crystal. Parallel tuning avoids problems resulting from undesired shunt capacitances to ground. However, it is inherently possible to modulate the tuned frequency of a crystal controlled circuit over a broader range about the series resonance frequency than about the parallel resonance frequency. Basically, the reason for the above is that inharmonic resonance modes generally occur closer to the parallel resonance frequency than to the series resonance frequency, and frequency modulation cannot be carried into the region of inharmonic resonance without distortion. It is a particular object of my invention to make it possible to modulate a variable-frequency crystal-controlled oscillator about the series resonance frequency of the crystal in a manner linearly dependent on an applied voltage, and without interference by shunt capacitances.

Briefly, the above and other objects of my invention are attained by a crystal oscillator comprising a novel frequency determining circuit resonant at a frequency $f$ that is linearly dependent upon an applied modulating voltage $V_m$ over a range of frequencies, about a center frequency $f_0$, to which the crystal can be "pulled" by circuit tuning. The frequency determining circuit consists of two parts. A first part comprises a network, including the frequency controlling crystal, whose admittance is highly dependent upon frequency. The second part comprises a network including the voltage-controlled capacitance and other passive components selected such that the equivalent admittance of the second network is, to a good approximation over the frequency range of interest, a function that is linear with frequency. The admittance of the network forming the second part of the circuit is also a non-linear function of modulating voltage. Thus, the admittance of the first portion of the frequency determining network, $Y_x$ may be expressed as $Y_x=G_1(f)$. The admittance $Y_m$ of the second portion of the circuit may be expressed as: $Y_m=G_2(V_m, f)$. The components are selected, in a manner to be described below, such that the frequency determining network is at parallel resonance, over the frequency range of interest, at a frequency determined by the modulating voltage $V_m$. Accordingly, $Y_m=-Y_x$. As it is desired that, over the range of interest, the frequency of operation be proportional to modulating voltage $V_m$, it is necessary that $f-f_0=kV_m$, where $k$ is a constant. A sufficient condition is that $G_1(f)=-G_2(V_m, f)$. While it is not in general possible to make the function $G_1$ have exactly the same form as $G_2$ over any appreciable range, I have discovered that it is quite practical to make $G_1$ substantially identical to $G_2$ over a practical range of frequencies by selection of the constants in two portions of the circuit in a manner to be described in detail below.

In general, while the variation of $Y_m$ with $V_m$ may be highly non-linear, for the practical range of interest noted the functions $G_1$ and $G_2$ will be representatable by convergent series. Assume that both functions are represented in convergent series, with $G_1$ in ascending powers of $(f-f_0)$ and $G_2$ in ascending powers of $V_m/V_b$, where $V_b$ is a constant reference voltage as follows:

$$G_1(f)=f[a_1(f-f_0)+a_2(f-f_0)^2+a_3(f-f_0)^3+ \cdots +a_n(f-f_0)^n+ \cdots]$$

$$G_2(V_m,f)=f\left[b_1\left(\frac{V_m}{V_b}\right)+b_2\left(\frac{V_m}{V_b}\right)^2+b_3\left(\frac{V_m}{V_b}\right)^3+ \cdots +b_n\left(\frac{V_m}{V_b}\right)^n+ \cdots\right]$$

If $G_1(f)$ is to equal $-G_2(V_m,f)$, then $$a_1(f-f_0)=b_1\left(\frac{V_m}{V_b}\right)$$

$$a_2(f-f_0)^2=b_2\left(\frac{V_m}{V_b}\right)^2$$

$$a_3(f-f_0)^3=b_3\left(\frac{V_m}{V_b}\right)^3$$

$$\vdots$$

$$a_n(f-f_0)^n=b_n\left(\frac{V_m}{V_b}\right)^n$$

$$\vdots$$

As a practical matter, for design purposes the approximation to linearity will be sufficiently good if the first few terms of this series are equated. As will be pointed out below, in practice voltage controlled crystal oscillators made in accordance with my invention have better linearity than that indicated by the mathematical approximation.

The apparatus of my invention will best be understood in the light of the following detailed description, together with the accompanying drawings, of illustrative embodiments thereof.

Figure 1:
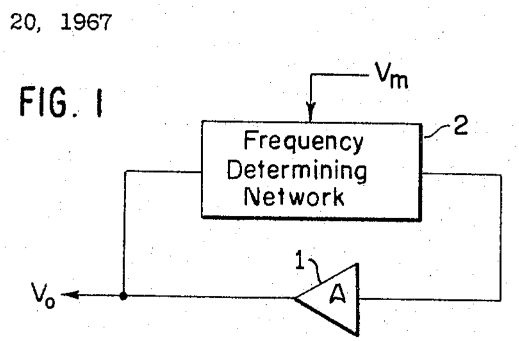
FIG. 1 is a block diagram of a voltage-controlled oscillator.

In FIG. 1, I have shown a conventional voltage controlled crystal oscillator comprising an amplifier 1 connected to a frequency determining network 2. The circuit produces an output voltage $V_0$ having a frequency that is a function of an applied modulating voltage $V_m$.

While there are many ways in which a frequency determining network may be interconnected with an amplifier to act as an oscillator, typically the frequency determining network is a circuit that is resonant at the frequency of oscillation and selectively provides regenerative feedback to the amplifier at that frequency. Such a resonant circuit is illustrated schematically in FIG. 2, and comprises a crystal circuit generally indicated at 3 and a modulating circuit generally indicated at 4. The crystal circuit 3 has an admittance $Y_x$ that is a function of frequency and the modulating circuit 4 has an admittance $Y_m$ that is a function of frequency and also is a non-linear function of the applied modulating voltage $V_m$. As shown, the modulating circuit and the crystal circuit are connected in parallel, such that the equivalent admittance of the resonant circuit is $Y_x+Y_m$.

Figure 3:
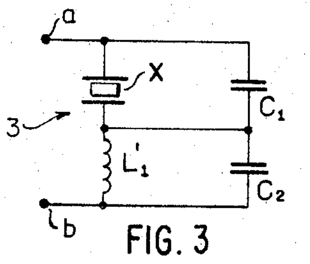
FIG. 3 is a schematic wiring diagram of a crystal circuit forming a part of the network of FIG. 2.

FIG. 3 shows a typical crystal circuit 3, for use in the parallel resonance mode. The circuit includes a frequency control crystal X connected in series with an inductor $L_1'$. A capacitor $C_1$ is connected in parallel with the crystal X, and a capacitor $C_2$ is connected in parallel with the inductor $L_1'$.

Figure 4:
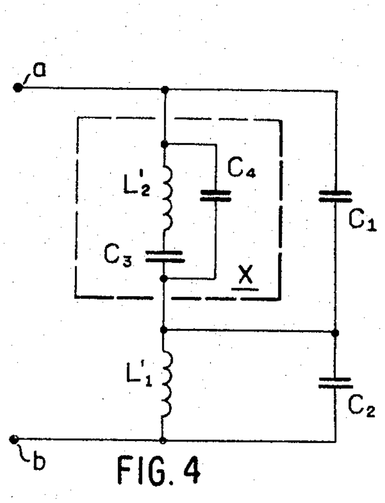
FIG. 4 is a schematic diagram of the actual equivalent circuit of the apparatus of FIG. 3.

FIG. 4 shows the equivalent circuit, in which the schematic symbol for the crystal X has been replaced by the conventional equivalent network for a crystal which includes an inductance $L_2'$, a capacitor $C_3$ in series with the inductor $L_1'$, and a capacitor $C_4$ in parallel with the series combination of the inductor $L_2'$ and the capacitor $C_3$. In this equivalent circuit, as in others to be described, resistances have been ignored as irrelevant to the selection of the reactive components.

Figure 5:
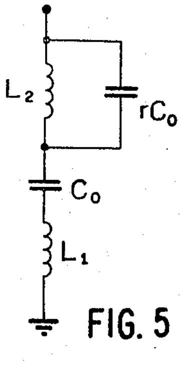
FIG. 5 is a schematic diagram of a useful approximate equivalent circuit for the apparatus of FIG. 3.

Since voltage controlled crystal oscillators are inherently limited to a frequency range close to the resonant frequency of the selected crystal, for practical purposes the circuit of FIG. 4 can be replaced by the simpler equivalent circuit of FIG. 5. In FIG. 5, the various capacitors of FIG. 4 have been replaced by a capacitor $C_0$, and a capacitor having a capacitance $r\ C_0$, where $r$ is a constant. $L_1$ in FIG. 5 is slightly greater than $L_1'$. The function of $C_2$ is to tune $L_1'$. It is small and can be ignored. If $C_2$ is ignored, it can be shown that the circuits of FIGS. 4 and 5 are canonical forms where $$C_0=C_1+C_3+C_4$$

$$r=\frac{C_1+C_4}{C_3}$$

$$L_2=\frac{L_2'C_3^2}{(C_1+C_3+C_4)^2}\simeq\frac{L_2'}{r^2}$$

In terms of the equivalent circuit of FIG. 5, the admittance $Y_x$ of the crystal circuit of FIG. 3 is given by:

$$(1)\qquad Y_x=\frac{-j\omega C_0(1-\omega^2L_2rC_0)}{\omega^2L_2C_0-(1-\omega^2L_2rC_0)\ (1-\omega^2L_1C_0)}$$

where $\omega=2\pi f$ and $f$=frequency in cycles per second

By definition, $$\omega_0^2\triangleq\frac{1}{L_2rC_0}$$

and $$\omega_s^2\triangleq\frac{1}{L_1C_0}$$

Then Equation 1 becomes $$(2)\qquad Y_x=\frac{-j\omega C_0\left(1-\frac{\omega^2}{\omega_0^2}\right)}{\frac{\omega_2}{r\omega_0^2}-\left(1-\frac{\omega^2}{\omega_0^2}\right)\left(1-\frac{\omega^2}{\omega_s^2}\right)}$$

Let $$\omega_0\triangleq 2\pi f_0$$

and $$\omega_s\triangleq 2\pi(f_0+\Delta f_0)$$

where $f_0$ is the parallel resonant frequency of the crystal, $\Delta f_s$ is the frequency difference between $f_0$ and the series resonant frequency of the series combination $L_1$ $C_0$, and $\omega_s$ is the series resonant angular frequency of this combination in radians per second. The term $\omega$ may be written as $w=2\pi$ $(f_0+\Delta f)$, where $\Delta f=f-f_0$ With these definitions, and ignoring terms such as $$\left(\frac{\Delta f^2}{f_0^2}\right)$$

and $$\left(\frac{\Delta f_s^2}{f_0^2}\right)$$

that are inherently very small with respect to other terms over the operating frequency ranges of interest, it can be shown that $$(3)\quad Y_x=\frac{-j\omega C_0\left(\frac{-2\Delta f}{f_0}\right)}{\frac{1}{r}\left(1+\frac{2\Delta f}{f_0}\right)+\left(\frac{2\Delta f}{f_0}\right)\frac{\left(\frac{2\Delta f_s}{f_0}-\frac{2\Delta f}{f_0}\right)}{1+\frac{2\Delta f_s}{f_0}}}$$

Define $$y\overset{\Delta}{=}\frac{2\Delta f}{f_0}$$

and $$D\overset{\Delta}{=}\frac{2\Delta f_s}{f_0}$$

Equation 3 can then be written as:

$$(4)\quad Y_x=\frac{j\omega C_0 y}{\frac{1}{r}(1+y)+y\left(\frac{D-y}{1+D}\right)}$$

Rewriting, $$Y_x=\frac{jr\omega C_0 y}{1+y+ry\left(\frac{D-y}{1+D}\right)}$$

The term $ry\left(\frac{D-y}{1-D}\right)$ can be written as:

$$ry\frac{(D-y)(1-D)}{(1+D)(1-D)}=ry\frac{(D-y-D^2+yD)}{(1-D^2)}$$

since $D<1$, $(1-D^2)\cong 1$ and (5) can be approximated as:

$$Y_x=\frac{jr\omega C_0 y}{1+y+ry(D-y-D^2+yD)}$$

or $$(6)\quad Y_x=\frac{jr\omega C_0 y}{1+y(1+rD-rD^2)-ry^2(1-D)}$$

With the use of the binominal expansion of $(1+x)^{-1}$, where $x=y$ $(1+rD-rD^2)-ry^2(1-D)$, and approximations based on the facts that $r>1$, $rD<r$, and $2rD^2<r$, it can be shown that, to a sufficient approximation, $Y_x$ is given by:

$$(7)\quad Yx=jrwC_0 y[1-yrD+y^2r(1+rD^2)+\ .\ .\ .\ ]$$

Equation 7 can evidently be expressed as $$Y_x=f[G_3(f)]=G_1(f)$$

Next, the derivation of the admittance $Y_m$ of the modulating circuit, as $Y_m=G_2(V_m f)=f[G_4(V_m)]$, will be considered. Finally, the construction of the circuits necessary to make $G_3(f)=-G_4(V_m)$ over a practical range of frequencies and modulating voltage will be described.

Figure 2:
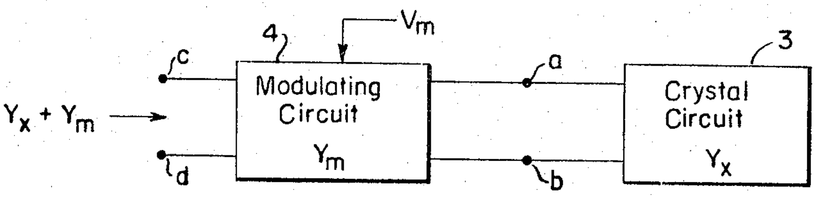
FIG. 2 is a block diagram of a voltage controlled frequency determining network useful in the oscillator circuit of FIG. 1.
Figure 6:
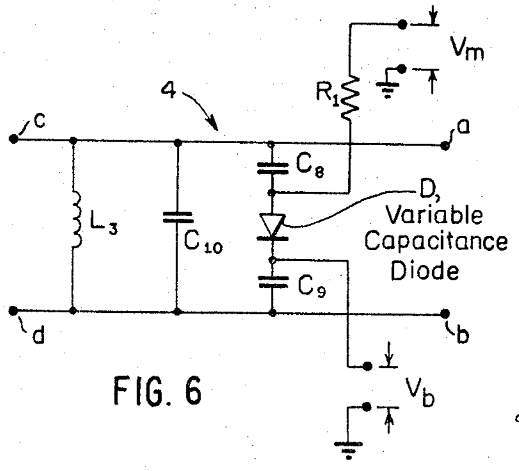
FIG. 6 is a schematic diagram of a modulating circuit forming a part of the apparatus of FIG. 2.

FIG. 6 shows a modulation circuit usable in the configurations of FIGS. 1 and 2. As shown, the circuit generally indicated at 4 includes a variable capacitance diode D arranged to be supplied with a suitable bias voltage $V_b$ to set the operating point, and a modulating voltage $V_m$, which may be either a varying or an adjustable constant direct voltage, positive with respect to ground, and supplied to the diode through a relatively large resistor R1. DC isolation is provided by a pair of capacitors $C_8$ and $C_9$ connected in series with the diode D. The capacitances of $C_8$ and $C_9$ are usually very large in comparison with the capacitance of the diode D and therefore have relatively little effect on the value of the capacitance of the branch of the circuit in which the diode D appears. In general, the capacitor $C_8$ will be a component specifically provided for the purpose, but the capacitor $C_9$ may be omitted if the power supply terminal from which the bias voltage $V_b$ is supplied is at AC ground potential. As shown, the path including the capacitors $C_8$ and $C_9$ and the diode D is connected across the input terminals *a* and *b* of the modulating circuit 4. A capacitor $C_{10}$ and an inductance $L_3$ are connected in parallel with these components. If the sum of the capacitances $C_8$ and $C_9$ and the capacitance of the diode D is represented as $Cd$, it will be apparent from elementary considerations that the admittance $Y_m$ of the modulating circuit, as seen either from the input terminals *a* and *b* or from the output terminals *c* and *d*, will be given by $$Y_m=\frac{-j}{\omega L_3}+j\omega C_{10}+j\omega Cd$$

The capacitance $C_d$ may be represented as $$C_d=\frac{C_b}{\sqrt{1-\frac{V_m}{V_b}}}$$

Accordingly, the admittance $Y_m$ of the modulating circuit can be expressed as a function of the passive components and of the voltages $V_m$ and $V_b$ as $$(8)\quad Y_m=j\left(\frac{-1}{\omega L_3}+\omega C_{10}+\frac{\omega C_b}{\sqrt{1-\frac{V_m}{V_b}}}\right)$$

$$\text{Let } F\left(\frac{V_m}{V_b}\right)\overset{\Delta}{=}\left(1-\frac{V_m}{V_b}\right)^{\frac{-1}{2}}$$

Expanding F in MacLaurin's series, $$(9)\quad F\left(\frac{V_m}{V_b}\right)=1+\frac{1}{2}\left(\frac{V_m}{V_b}\right)+\frac{3}{8}\left(\frac{V_m}{V_b}\right)^2+\frac{5}{16}\left(\frac{V_m}{V_b}\right)^3+\ .\ .\ .$$

Substituting in (8), $$(10)\quad Y_m=j\left(\frac{-1}{\omega L_3}+\omega C_{10}+\omega C_b\right)+j\omega C_b\left(\frac{1}{2}\left(\frac{V_m}{V_b}\right)+\frac{3}{8}\left(\frac{V_m}{V_b}\right)^2+\frac{5}{16}\left(\frac{V_m}{V_b}\right)^3+\ .\ .\ .\right)$$

Figure 7:
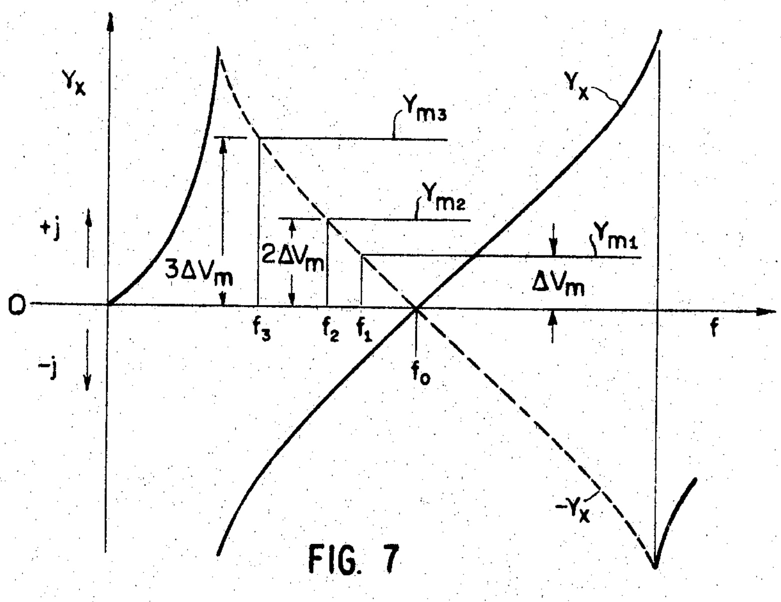
FIG. 7 is a graph of admittance versus frequency illustrating a non-linear mode of operation of the apparatus of FIG. 2.
Figure 8:
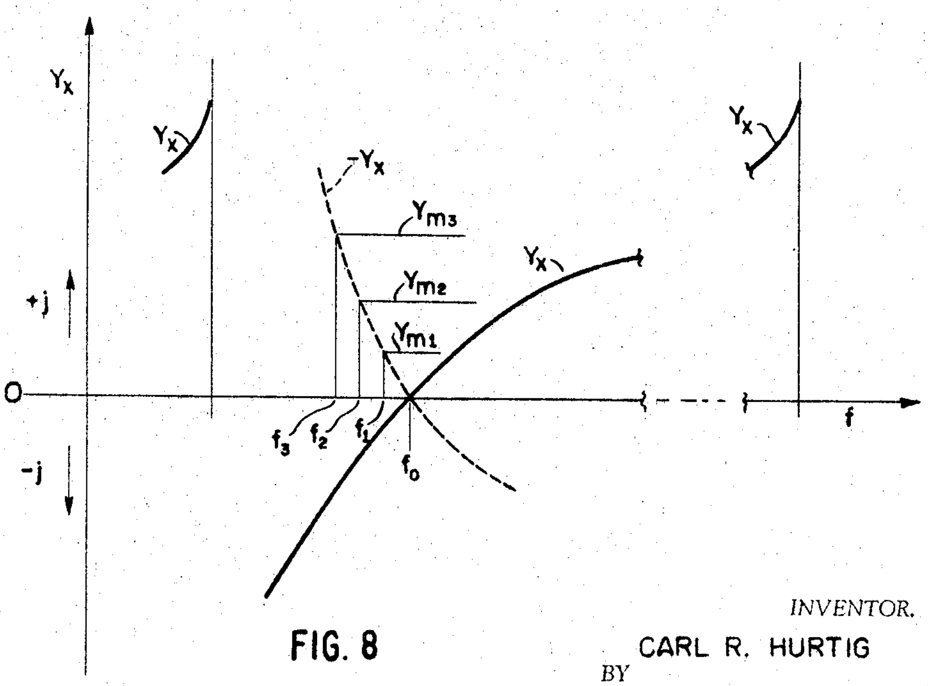
FIG. 8 is a second graph of admittance versus frequency illustrating the operation of the apparatus of FIGS. 1 and 2 when constructed in accordance with my invention.

The problem of providing a voltage-controlled crystal oscillator whose frequency is a linear function of the applied modulating voltage can be better understood by reference to FIGS. 7 and 8 and the following discussion.

FIG. 7 is a graph of admittance versus frequency for a conventional construction of a crystal circuit 3 and a modulating circuit 4. The maximum values, or poles, of the admittance $Y_x$ correspond to the series resonance states of the crystal circuit 3, and zero values correspond to parallel resonance states. The dotted line is a plot of $-Y_x$. Superimposed on this graph are values of $Y_m$, corresponding to three different values of $V_m$ each equally spaced. Assuming that the frequency determining network comprising the circuits 3 and 4 resonates at $f_0$ with $V_m=0$, a first increment of modulating voltage $\Delta V_m$ will produce an admittance $Y_{m_1}$ of the modulating circuit which may have an intersection with the corresponding curve of $-Y_x$ at a frequency $f_1$ at which the frequency determining network is at resonance. For twice the modulating voltage increment, or $2\Delta V_m$, the admittance $Y_{m_2}$ is equal and opposite in value to the admittance $Y_x$ at a second frequency $f_2$. It will be observed that the difference in frequency between $f_1$ and $f_2$ is not the same as the difference between $f_0$ and $f_1$. Similarly, a third equal increment of modulating voltage produces a third modulating impedance $Y_{m_3}$ that is equal and opposite to the crystal circuit admittance $Y_x$ at a frequency $f_3$. It will be obvious that the resonant frequency of the combined circuit as so described is not a linear function of the modulating voltage.

Referring to FIG. 8, in accordance with my invention the components of the crystal circuit of FIG. 5 and the modulating circuit of FIG. 6 are selected so that the admittance curve $Y_x$ has a negative, $-Y_x$, that intersects with the values of $Y_m$ induced by equal increments of the modulating voltage $V_m$ at frequencies $f_1$, $f_2$, and $f_3$ that are linearly related to the increments in modulating voltage. The manner in which the components are selected to produce this result will next be described.

First, select the values of $L_3$, $C_{10}$ and $C_b$ in the modulating circuit 4 to satisfy the relation:

$$\omega_0^2=\frac{1}{L_3(C_{10}+C_b)} \tag{11}$$

Thus, in the vicinity of $\omega_0$, $$\left(\frac{-1}{\omega L_3}+\omega C_{10}+\omega C_b\right)\simeq 0$$

Then Equation 10 becomes, approximately, $$Y_m\approx j\omega C_b\left[\frac{1}{2}\left(\frac{V_m}{V_b}\right)+\frac{3}{8}\left(\frac{V_m}{V_b}\right)^2+\frac{5}{16}\left(\frac{V_m}{V_b}\right)^3\right] \tag{12}$$

Applying the condition $$Y_m=-Y_x$$

Equations 7 and 12 may be equated, term by term, to give $$-ryC_0=\frac{C_b}{2}\frac{V_m}{V_b} \tag{13}$$

$$C_0r^2Dy^2=\frac{3}{8}C_b\left(\frac{V_m}{V_b}\right)^2 \tag{14}$$

$$-C_0r^2(1+rD^2)y^3=\frac{5}{16}C_b\left(\frac{V_m}{V_b}\right)^3 \tag{15}$$

From (13)

$$y=-\frac{C_b}{2rC_0}\frac{V_m}{V_b} \tag{16}$$

$$\Delta f=-\frac{f_0C_b}{4rC_0}\frac{V_m}{V_b} \tag{17}$$

Substituting (16) into (14) and rearranging yields $$\frac{DC_b}{C_0}=\frac{3}{2}$$

$$D=\frac{3C_0}{2C_b} \tag{18}$$

$$\text{Thus, } \Delta f_s=\frac{3}{4}f_0\frac{C_0}{C_b} \tag{19}$$

Substituting (16) into (15)

$$-(1+rD^2)(-)\frac{C_b^2}{rC_0^2}=\frac{5}{2}$$

$$\left(\frac{1+rD^2}{r}\right)\left(\frac{C_b^2}{C_0}\right)=\frac{5}{2} \tag{20}$$

From (18)

$$\frac{1}{r}\left(1+r\frac{9}{4}\frac{C_0^2}{C_b^2}\right)\left(\frac{C_b}{C_0}\right)^2=\frac{5}{2}$$

$$\frac{1}{r}\left(\frac{C_b}{C_0}\right)^2+\frac{9}{4}=\frac{5}{2}$$

$$\left(\frac{C_b}{C_0}\right)^2\frac{r}{4}$$

$$\frac{C_b}{C_0}=\frac{\sqrt{r}}{2} \tag{21}$$

From Equations 17, 19 and 21, the basic design criteria are available. The following specifications are typical of an oscillator with a peak deviation of ±0.1%.

| | |
|---|---|
| Center frequency ________________kc./sec.__ | 30,000 |
| Peak deviation ______________________do.____ | 30 |
| Power supply ______________________volts__ | 28 |
| Linearity of modulation, cps. from best straight line __________________________________ | ±300 |
| Modulation voltage _______________v. peak__ | 5 |

Size, power, temperature range, modulation input impedance and other parameters can be specified but are not critical to this example.

From considerable experience, it should be observed that a crystal with the largest spot size (i.e., largest $C_3$) should be employed that is compatible with inharmonic modes. For this example, a crystal with a $C_3$ of .004 pf. and a static capacitance ($C_4$) of 1.5 pf. is used. If the total capacitance $C_1$ (including the stray wiring capacitance) is 0.5 pf., then the ratio $r=500$.

From Equation 21 the value of $C_b$ is $$C_b\approx\frac{C_0\sqrt{r}}{2}\ \frac{2.0}{2}\sqrt{500}\ 22.4\text{ pf.}$$

Also from (19)

$$\Delta fs=\frac{3}{4}f_0\frac{C_0}{C_b}$$

$$=\frac{3}{4}(30{,}000)\frac{2}{22.4}$$

$$\approx 2000\text{ kc./sec.}$$

From (17)

$$-\frac{V_m}{V_b}=\frac{4rC_0}{C_b}\frac{\Delta f}{f_0}$$

$$=\pm4(500)\frac{2}{22.4}\times\frac{1}{1000}$$

$$=\pm\frac{4}{22.4}=\pm.18$$

$$-V_m\approx\pm.18V_b$$

From the power supply limit of 28 volts the variable capacitance diode and bias are chosen. For example, a Zener regulated voltage of 18 volts can be conveniently obtained with a 25 volt supply. Thus, the diodes are chosen to obtain approximately 22.4 pf. at a quiescent bias of 18 volts. The voltage required to achieve the modulation is approximately 3.2 volts peak. Thus, a resistor divider can be employed to reduce the specified 5 volts peak to a value of 3.2. Other solutions can be obtained by increasing the value of $C_1$, and/or $V_b$ to the limit of increasing $V_m$ to a value of 5 volts peak.

Figure 9:
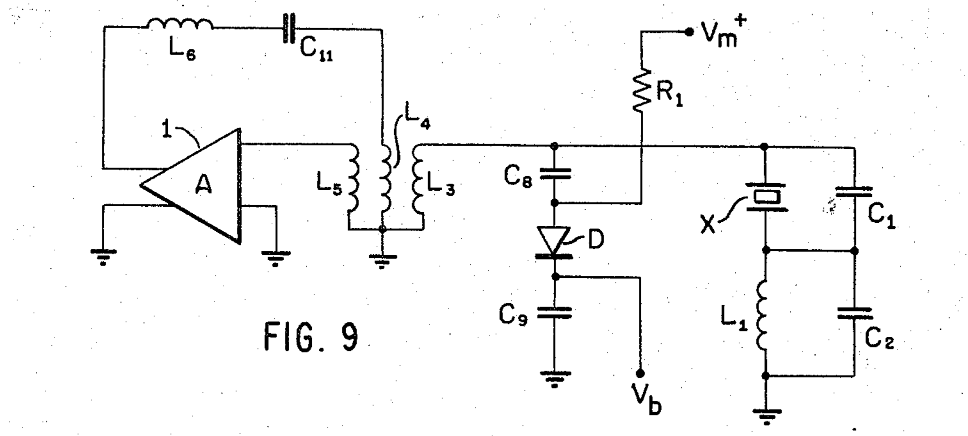
FIG. 9 is a schematic embodiment of an oscillator in accordance with a practical embodiment of my invention.

FIG. 9 shows a specific embodiment of the apparatus of my invention. As shown, the frequency determining network comprising the crystal circuit of FIG. 3 and the modulating circuit of FIG. 6, connected in parallel, is coupled to the input and output circuits of the amplifier 1 by means of a transformer comprising a primary winding $L_3$, a secondary winding $L_5$ connected to the input terminals of the amplifier 1, and another secondary winding $L_4$. The winding $L_4$ is connected in series with inductor $L_6$ and a capacitor $C_{11}$ to the output terminal of the amplifier 1. The inductance $L_3$ of this circuit, for use in Equation 11, for example, is the inductance seen across the terminals of the winding $L_3$ as reflected by the various circuits coupled to the winding.

Figure 10:
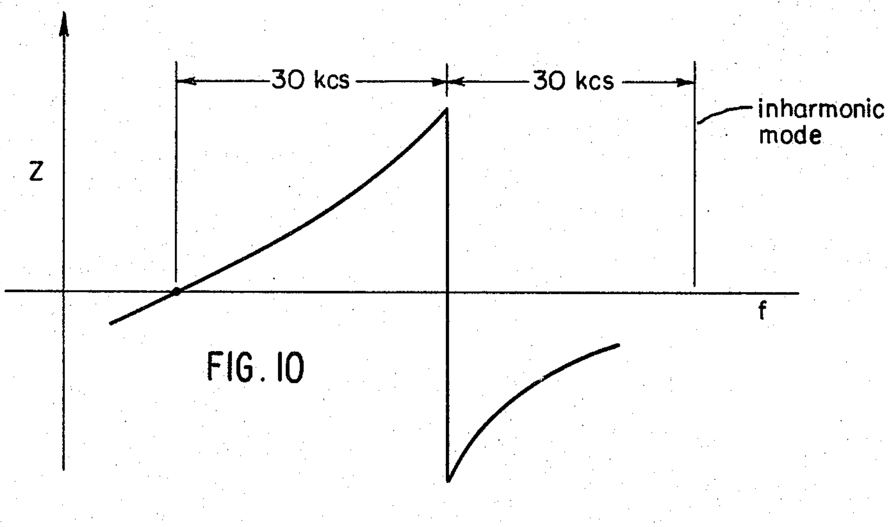
FIG. 10 is a graph of the impedance versus frequency characteristic of a crystal.

While the apparatus thus far described is useful for many purposes, it is inherently limited in per cent modulation by adjacent inharmonic modes. FIG. 10 illustrates a typical impedance curve in the vicinity of 30 megacycles per second for a frequency determining network of the type shown in FIG. 2. As shown, the pole typically occurs at, say, 30 kilocycles per second above the zero. An inharmonic mode may occur as close as 60 kilocycles per second above the zero at series resonance. Thus, there is only a clear band 30 kilocycles per second wide on either side of the impedance pole (or admittance zero) at parallel resonance. Therefore, a voltage controlled oscillator in which the crystal is operated at parallel resonance cannot be modulated over a band more than 30 kilocycles per second, on either side of the center frequency, or at a rate of more than 30 kilocycles per second over any band, without distortion introduced by inharmonic resonance. However, a band of 60 kilocycles per second is available above the zero at series resonance.

Figure 11:
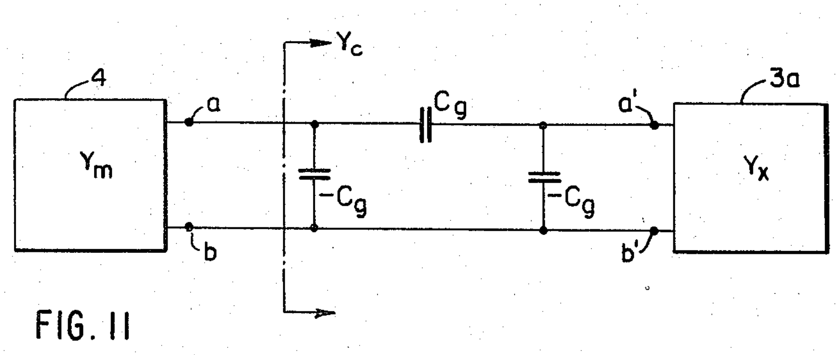
FIG. 11 is a diagram partially schematic and partially in block form illustrating a modification of the apparatus of my invention.

FIG. 11 shows a theoretical frequency determining network which can be operated in the vicinity of the series resonance of the frequency control crystal while retaining the practical advantages of operation of the modulation circuit at parallel resonance. In FIG. 11, the modulating circuit 4 may be the same as in FIGS. 2 and 6, and has an admittance $Y_m$. The crystal circuit 3*a* is adapted for use near the series resonant frequency of the crystal, in a manner to appear, and has an admittance $Y_x$. Interconnecting the circuits 3*a* and 4 is a hypothetical "gyrator" network, comprising a negative capacitance $-C_g$ connected across the output terminals *a'* and *b'* of the circuit 3*a*, a negative capacitance $-C_g$ connected across the input terminals *a* and *b* of the circuit 4, and a positive (or real) capacitance $C_g$ connected between terminals *a'* and *a*. The admittance $Y_c$ of the combined gyrator and crystal circuit 3*a*, seen by the circuit 4 at the terminals *a* and *b*, can be shown by elementary considerations to be:

$$Y_c = -\frac{Y_g^2}{Y_x} \tag{23}$$

If both of the circuits 3*a* and 4 are tuned so that $Y_m = Y_c$ at $\omega_0$, where $\omega_0$ is the series resonant frequency of the crystal in the circuit 3*a*, the effect will be a crystal controlled circuit operated at series resonance but having the impedance characteristics of operation at parallel resonance. And, while Equation 23 is dependent upon the hypothetical gyrator concept, it will be shown below that the same result can be obtained in a real circuit by proper selection of the component values.

Figure 12:
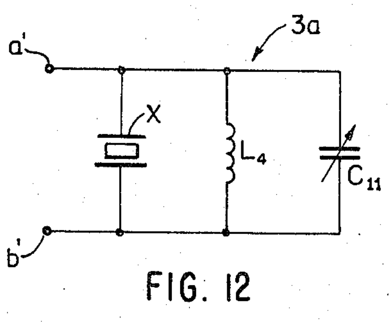
FIG. 12 is a schematic diagram of a crystal circuit suitable for use in the apparatus of FIG. 11.
Figure 13:
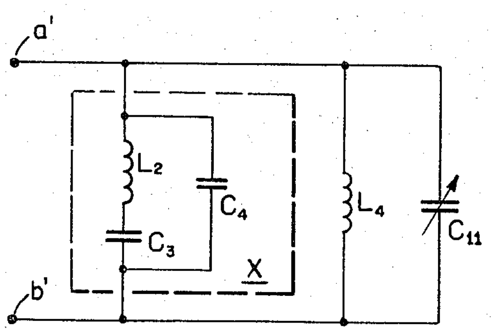
FIG. 13 is a schematic diagram of the equivalent circuit of the apparatus of FIG. 12.

FIG. 12 shows an actual crystal circuit suitable for use as the circuit 3*a* in FIG. 11, and FIG. 13 shows the equivalent circuit in which the symbol for the crystal X has been replaced by a capacitor $C_4$ connected in parallel with the series combination of an inductor $L_2$ and a capacitor $C_3$. For operation at the series resonant frequency of the crystal, an inductor $L_4$ and a variable capacitor $C_{11}$ are connected in parallel with the crystal X.

In terms of the equivalent circuit of FIG. 13, the admittance $Y_x$ of the crystal circuit, as seen at the output terminals *a'* and *b'*, can be shown to be:

$$Y_x = j\omega(C_4 + C_{11}) + \frac{1}{j\omega L_y} + \frac{1}{j\omega L_2 + \frac{1}{j\omega C_3}} \tag{24}$$

let $C_4 + C_{11} = C_p$ $$Y_x = j\omega C_p\left[1 - \frac{1}{\omega^2 L_4 C_p} + \frac{C_3}{C_p}\left(\frac{1}{1 - \omega^2 L_2 C_3}\right)\right] \tag{25}$$

but by definition $\frac{C_3}{C_p} = \frac{1}{r}$ $$Y_x = j\omega C_p\left[1 - \frac{\omega_s^2}{\omega^2} + \left(\frac{1}{r}\right)\left(\frac{1}{1 - \frac{\omega^2}{\omega_0^2}}\right)\right] \tag{26}$$

$$Y_x \simeq j\omega C_p\left[1 - \frac{1 + \frac{2\Delta fs}{f_0}}{1 + \frac{2\Delta f}{f_0}} + \left(\frac{1}{r}\right)\left(\frac{1}{-2\frac{\Delta f}{f_0}}\right)\right] \tag{27}$$

approximating the denominator $$Y_x = j\omega C_p\left[1 - \left(1 + \frac{2\Delta f_s}{f_0}\right)\left(1 - \frac{2\Delta f}{f_0}\right) - \frac{1}{2r\frac{\Delta f}{f_0}}\right]$$

$$\text{Let } y = \frac{2\Delta f}{f_0} \text{ and } D = \frac{2\Delta f_s}{f_0}$$

$$Y_x \simeq j\omega C_p\left[y - D + yD - \frac{1}{ry}\right] \tag{28}$$

$$Y_x = -\frac{j\omega C_p}{ry}\ 1 + rDy - ry^2) + D)] \tag{29}$$

From (23)

$$Y_c = -\frac{Y_g^2}{Y_x} = \frac{\omega^2 C_g^2}{Y_x}$$

$$Y_c = \frac{\omega^2 C_g^2 ry}{-j\omega C_p}\left[\frac{1}{1 + rDy - ry^2(1 + D)}\right] \tag{30}$$

$$Y_c = +j\omega\frac{C_g^2 r}{C_p}\ y[1 - rDy + ry^2(1 + D) + r^2D^2y^2]$$

$$Y_c = +j\omega\frac{C_g^2 r}{C_p} y[1 - rDy + ry^2(1 + D + rD^2)] \tag{31}$$

Letting $Y_c = -Y_m$, and for that purpose equating Equations 10 and 31 term by term while accounting for the negative sign, the following conditions are obtained.

$$\frac{C_g^2 ry}{C_p} = -\frac{C_b V_m}{2V_b} \tag{32}$$

$$\frac{C_g^2 ry}{C_p}(rDy) = -C_b\frac{3}{8}\left(\frac{V_m}{V_b}\right)^2 \tag{33}$$

$$\frac{C_g^2 ry}{C_p}(ry^2)(1 + D + rD^2) = -C_b\frac{5}{16}\left(\frac{V_m}{V_b}\right)^3 \tag{34}$$

From Equation 32

$$y = -\frac{C_b C_p V_m}{2C_g^2 r V_b} = -\frac{C_b C_{1x}}{2C_g^2}\left(\frac{V_m}{V_b}\right) \tag{35}$$

substituting (35) into (33) and (34)

$$\frac{C_b C_p}{C_g^2} D = \frac{3}{2} \tag{36}$$

$$D^2 - \frac{9}{r}D - \frac{9}{r} = 0 \tag{37}$$

Equation 37 may be solved without approximation. However, with an error less than 10% for most applications Equation 37 may be approximated by:

$$D = \frac{3}{\sqrt{r}} \tag{38}$$

From (36)

$$\frac{C_b C_p}{C_g^2} = \frac{\sqrt{r}}{2} \tag{39}$$

Thus, the value of modulation capacitance $C_b$ is $$C_b = \frac{\sqrt{r}}{2}\frac{C_g^2}{C_p} = \frac{C_g^2}{2\sqrt{r}C_3} \tag{40}$$

From (38)

$$f_s = \frac{1.5 f_0}{\sqrt{r}} \tag{41}$$

From the above equations, and conventional design considerations, the values of the passive components can be selected. The actual selection of values is similar to the previous example. It is of value to recite that an additional degree of freedom is obtained in the selection of the component value of the gyrator capacitance.

Figure 14:
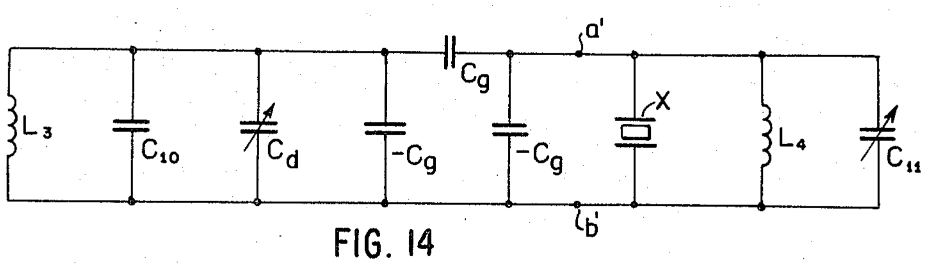
FIG. 14 is a schematic diagram of the theoretical circuit of FIG. 11 incorporating the circuits of FIGS. 9 and 13.
Figure 15:
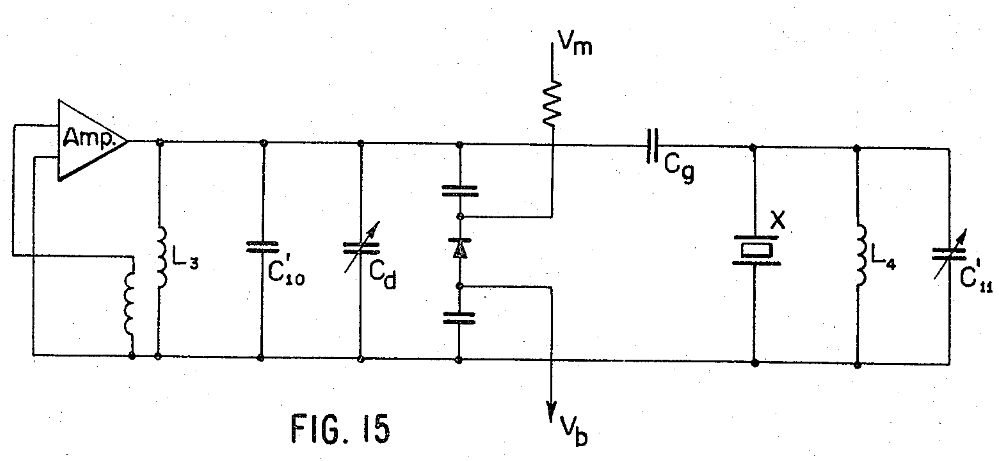
FIG. 15 is a schematic diagram of an actual circuit equivalent to the theoretical circuit of FIG. 14.

FIG. 14 shows the complete circuit of FIG. 11, including the circuits of FIGS. 6 and 12 and the gyrator connected in parallel. In order to construct an actual circuit performing in accordance with the theoretical performance of the circuit of FIG. 14, the negative capacitances in the gyrator are absorbed by lumping with real constants. FIG. 15 shows a practical circuit useable where the calculated value of $C_g$ is less than either $C_{10}$ or $C_{11}$. Capacitors $C_{10'}$ and $C_{11'}$ having capacitances $C_{10}-C_g$ and $C_{11}-C_g$, respectively, are used. Should the value of $C_g$ be larger than $C_{10}$ or $C_{11}$, substantially the same result could be obtained by substituting an inductance. For example, if $C_{10}-C_g$ is negative, an inductor having an inductance $$L=\frac{1}{\omega_0^2(C_g-C_{10})}$$

would be substituted for the capacitor $C_{10'}$.

Figure 16:
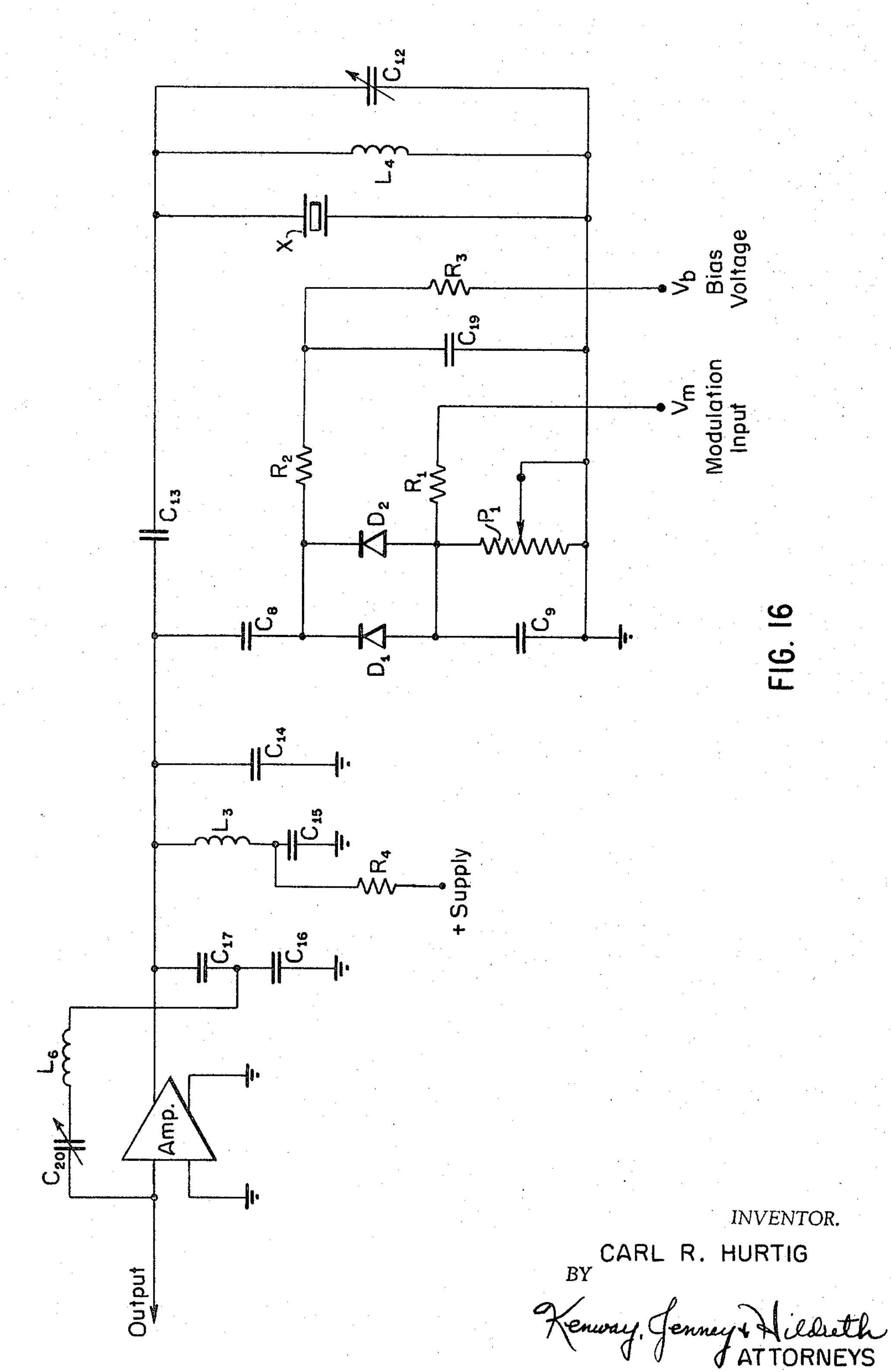
FIG. 16 is a schematic diagram of a voltage controlled oscillator in accordance with a preferred embodiment of my invention.

FIG. 16 shows a preferred embodiment of the linear variable frequency crystal controlled oscillator of my invention. The apparatus includes the crystal circuit of FIG. 12, comprising a tuning capacitor $C_{12}$ and a coupling capacitor $C_{13}$ corresponding to $C_g$ in FIGS. 11, 14 and 15. $C_{12}$ has a capacitance $C_{11}-C_{13}$ connected in parallel with the inductor $L_4$ and the crystal X. The modulation circuit is similar to the circuit of FIG. 6, except that two variable capacitance diodes $D_1$ and $D_2$ in parallel have been used. Two diodes are used to obtain a larger value of capacitance $C_b$ that can conveniently be obtained with one. The bias voltage $V_b$ is applied through two resistors $R_2$ and $R_3$ in series, and a smoothing capacitor $C_{19}$ is connected between the junction of the resistors $R_2$ and $R_3$ and ground. The modulating voltage $V_m$ is applied through a resistor $R_1$, connected in series with a potentiometer $P_1$ comprising a modulation sensitivity control. The output voltage of the frequency determining network is applied to the input of the amplifier by means of a voltage divider comprising a pair of capacitors $C_{16}$ and $C_{17}$ connected in series. The capacitor $C_{14}$ has a combined capacitance equal to $C_{10}-C_{13}$. Feedback to the amplifier is provided through a variable capacitor $C_{20}$ in series with an inductor $L_6$ from the junction of the capacitors $C_{16}$ and $C_{17}$.

While I have described my invention with respect to the details of various illustrative embodiments thereof, many changes and variations will occur to those skilled in the art upon reading my description, and such can obviously be made without departing from the scope of my invention.

Having thus described my invention, what I claim is:

1. A variable frequency crystal-controlled oscillator of the class comprising an amplifier having a regenerative feedback network for determining operating frequency, in which said feedback network includes a modulating circuit connected in parallel with a crystal circuit, said modulating circuit having a voltage controlled reactive impedance that is a non-linear function of applied modulating voltage and a group of passive reactive impedances connected in said circuit, said passive reactive impedances having reactances selected to make the admittance $Y_m$ of the modulating circuit substantially directly proportional to frequency over the range of modulation, whereby $Y_m=G_1(V_m,f)$, where $f$ is frequency, $V_m$ is the modulating voltage, and $G_1$ is said non-linear function, said crystal circuit comprising a frequency controlling crystal and passive reactive impedances connected in said crystal circuit having reactances selected so that the admittance $Y_x$ of the crystal circuit may be expressed as $Y_x=G_2(f)$ over the range of modulation where $G_2$ is a non-linear function of $f$, and the sum $$\sum_{i=1}^{\infty}(a_i-b_i)$$

equals approximately zero, where $a_i$ represents a term in a convergent infinite series expansion of $G_1$ $(V_m)$ and $b_i$ represents the corresponding term in a similar convergent infinite series expansion of $G_2(f)$.

2. A frequency determining network for a variable frequency crystal controlled oscillator, comprising a voltage responsive impedance having a reactance non-linearly related to applied modulating voltage connected in a modulating circuit with a first group of reactive impedances, the reactances of said first group being selected to make the admittance of the modulating circuit proportional to frequency over a desired range of frequencies, a crystal circuit comprising a frequency control crystal and a second group of reactive impedances, the reactances of said second group being selected to shape the response to frequency of the admittance of the crystal circuit to compensate for the non-linear response to voltage of the voltage responsive impedance, and means connecting the crystal circuit in parallel with the modulating circuit.

3. The apparatus of claim 2, is which said connecting means comprises a capacitor; said capacitor having a capacitance selected, and one reactance of each group being further selected, such that the impedance of the crystal circuit is reflected as an admittance to the modulating circuit, and in which said reactances are further selected so that the frequency determining network is at parallel resonance when the crystal is at series resonance.

4. The apparatus of claim 2, in which said connecting means is substantially non-reactive, and in which said impedances are selected so that the frequency determining network is at parallel resonance when the crystal is at parallel resonance.

5. A frequency determining network, comprising a crystal circuit comprising a first inductor and a first capacitor connected in parallel; a modulating circuit comprising a voltage responsive capacitor having a non-linear characteristic; a second inductor, and a third capacitor connected in parallel; and means connecting said first circuit and said second circuit in parallel; said third capacitor, said second inductor and said voltage responsive capacitor having values selected to be in resonance at a resonant frequency of said crystal, and said first capacitor and said first inductor having values chosen to shape the response to frequency of the admittance of said crystal circuit to cause the parallel resonant frequency of said frequency determining network to vary linearly with modulating voltage applied to said modulating circuit.

6. The apparatus of claim 5, in which said resonant frequency of said crystal is the series resonant frequency of the crystal, in which said connecting means comprises a fourth capacitor, and in which said fourth capacitor is selected, and said first and third capacitor are further selected, to reflect the impedance of the crystal circuit as an admittance to the modulating circuit.

7. The apparatus of claim 5, in which said resonant frequency of said crystal is the parallel resonant frequency of the crystal, and in which said connecting means is resistive.

No references cited.

JOHN KOMINSKI, *Primary Examiner.*